Nov. 7, 1967 NAOKAZU KIMURA 3,351,873

ANALOG TO DIGITAL CONVERTER EMPLOYING NOISE REJECTION SIGNAL MODULATOR

Filed July 8, 1964

INVENTOR
Naokazu Kimura
By Paul M. Craig, Jr.
ATTORNEY 3,351,873
Patented Nov. 7, 1967

3,351,873

ANALOG TO DIGITAL CONVERTER EMPLOYING NOISE REJECTION SIGNAL MODULATOR

Naokazu Kimura, Katsuta-shi, Japan, assignor to Hitachi, Ltd., Tokyo, Japan, a corporation of Japan Filed July 8, 1964, Ser. No. 381,106
2 Claims. (Cl. 332—9)

This invention relates to an analog-to-digital converter having an improved noise rejection electric signal modulator for averaging input voltages to modulate a source of pulsed voltages to produce voltage pulses of magnitude or time-width proportional to the average value of the input voltages.

An object of the present invention is to provide an analog-to-digital converter employing a signal modulator of extremely simple construction comprising an input winding, an output winding, a switch element, and constant-voltage elements.

Another object of the present invention is to provide an analog-to-digital converter employing the above mentioned improved signal modulator and having superior characteristics particularly when the input signals contain periodic noise components.

Another object of the present invention is to provide an analog-to-digital converter capable of completely removing effects of incoming periodic noises.

A further object of the present invention is to provide an analog-to-digital converter capable of eliminating incoming periodic noises as well as other pulse-form noises.

A further object of the present invention is to provide an analog-to-digital converter having superior filtering effect, and particularly suitable for use with apparatus such as data loggers, monitors, and etc.

There are other objects and particularities of the present invention, which will be made obvious from the following detailed descriptions of the invention, with reference to the accompanying drawings, in which.

Figure 1:
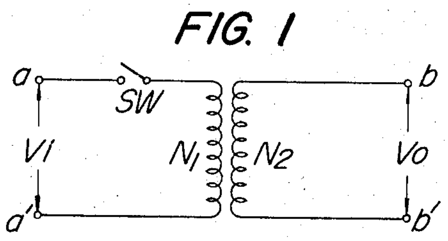
FIGS. 1 and 2 are circuit diagrams for explaining the principle of the noise rejection signal modulator comprising a part of the present invention.

Referring to FIG. 1, the improved noise rejection modulator circuit shown comprises input terminals *a, a'*, output terminals *b, b'*, a switch element SW, an input signal winding $N_1$, and an output signal winding $N_2$. If input voltage $V_i$ is applied across the input terminals *a, a'*, and the switch element SW is closed, the magnetic flux $\Phi_T$ at time T when time T elapsed from the closure of switch elements SW is given as below.

$$\Phi_T=\frac{1}{N_1}\int_0^T V_i dt \tag{1}$$

Here, it is to be noted that flux $\Phi_T$ shows a value proportional to the average value of input voltage $V_i$ for T time.

Now, it is assumed that the switch element SW is opened at time T. Then, the output voltage $V_O$ appearing across the output terminals *b, b'*, should satisfy the following equation $$\Phi_T=\frac{1}{N_2}\int_T^{T_1} V_O dt \tag{2}$$

If time $(T_1-T)$ is determined by the particular circuit conditions, the output voltage $V_O$ depends on the magnitude and polarity of flux $\Phi_T$, or the average value of input signal $V_i$ for T time.

Figure 2:
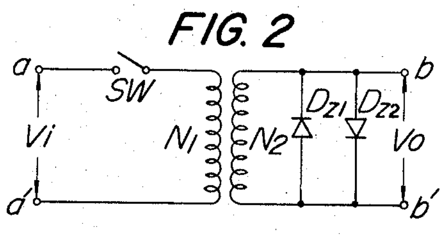

If constant voltage elements $D_{Z1}$ and $D_{Z2}$ are connected in the secondary circuit as shown in FIG. 2, the output voltage $V_O$ appearing across output terminals *b, b'*, is of a constant magnitude and of time width proportional to the average value of input signal voltage for T time.

The improved noise rejection signal modulator employed in the present invention is particularly suitable when the input voltage contains periodic noise component as explained below.

The input signal voltage $V_i$ is now represented by $$V_i=V_D+V_n \tag{3}$$

where $V_D$ is the direct current signal component, while $V_n$ is the noise component, when the noise component $V_n$ is of periodic nature, $$V_n=\sum_{K=1}^{\infty} V_K \sin(K\omega t+\phi_K) \tag{4}$$

where $V_K$ is amplitude, $\omega$ is angular frequency, and $\phi_K$ is phase difference of the noise component.

Now, substituting Equations 3 and 4 into Equation 1, we obtain $$\begin{aligned}\Phi_T&=\frac{1}{N_1}\int_0^T (V_D+V_n)dt\\&=\frac{1}{N_1}V_DT+\frac{1}{N_1}\sum_{K=1}^{\infty}\frac{2V_K}{K\omega}\sin\frac{K\omega T}{2}\sin\left(\frac{K\omega T}{2}+\phi_K\right)\end{aligned} \tag{5}$$

Now, in the circuits as shown in FIGS. 1 and 2, the first term of Equation 5 may be considered designating the signal component, while the second term may be considered designating the error due to the noise component.

Therefore, if the operating time T of the switch element SW and the instant of its operation is selected to satisfy $$\sum_{K=1}^{\infty}\frac{2V_K}{K\omega}\sin\frac{K\omega T}{2}\sin\left(\frac{K\omega T}{2}+\phi_K\right)=0 \tag{6}$$

from which the following can be derived:

$$\frac{K\omega T}{2}=n\pi \text{ or } \frac{K\omega T}{2}+\phi_K=n\pi \tag{7}$$

where *n* is integer, then, the effect of periodic noise can be removed completely.

Since the present apparatus integrates the input voltage in effect, its averaging function eliminates pulse-form noises also other than periodic ones.

Thus, it is understood that the present apparatus shows a superior filter effect, and is very suitable as a filter circuit of an analog-to-digital converter for use with apparatus such as data loggers, monitors, which have recently come into broad use in many fields, and which operates to select many points of measurement at a high speed, and to compare the measured signal with an established value for producing a signal for alarming, printing, or controlling. In such an apparatus, in order to increase preciseness of measurement, the filter effect is made large, and measurement is effected with many points of measurement being changed over, and consequently, a filter of short operating time is required. The present apparatus fully satisfies the above requirement, since most of the noise incoming with the input signal is induction noise from the electrical source, which is of periodic nature. For example, if the periodic noise signal is assumed to be induction noise from a 50-cycle electrical source, such a noise can be eliminated with a switch element SW of 1-cycle or 0.02-second operation time. On the contrary, with a conventional RC-LC filter circuit even of the most suitable characteristics, there is required operation time as long as several times that of the switch element SW.

Further, if the time of generation ($T_1-T$) of the output voltage $V_O$ is made minute in comparison to the operation time T of the switch element SW, the filter circuit itself can have a very large amplifying action. Consequently, if the present circuit is combined with a voltage comparator, a comparator of superior analyzing ability, is provided, even when the input signal is minute, or it contains noise.

Next is described an embodiment of the invention, for modulation into a pulse of time width proportional to the average value of input voltage.

Figure 3:
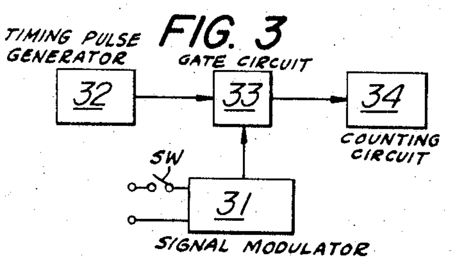
FIG. 3 is a block diagram showing an analog-to-digital converter having a signal modulator of the present invention incorporated therein.

The analog-to-digital convertor embodying the present invention shown in FIG. 3 comprises a modulator 31 as described above, a timing pulse generator 32, a gate circuit 33, and a counting circuit 34. Input signal is applied to the input terminals of modulator 31, and its switch element SW is operated for a definite time. After then, the switch element SW is opened, and at the same time, a pulse of time width proportional to the average value of input signals appears across the output terminals of modulator 31. During this time interval, the gate circuit 33 is kept open, and the counting circuit 34 counts the pulses, thus accomplishing analog-to-digital conversion. This analog-to-digital convertor is characterized by its independence from noise.

Figure 5:
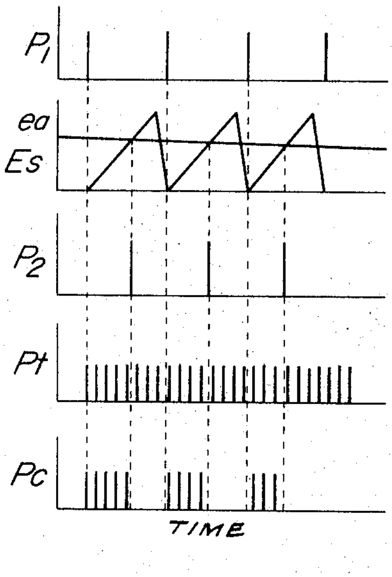
FIG. 5 is a graph for explanation of the operation of the converter shown in FIGURE 4.
Figure 4:
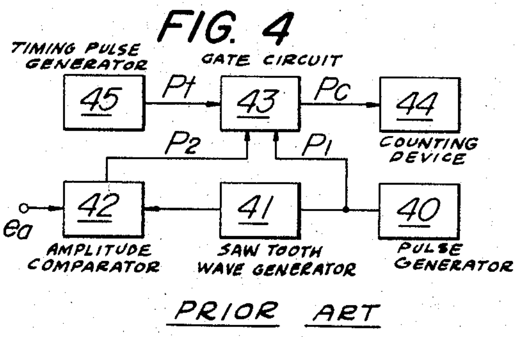
FIG. 4 is a block diagram showing a conventional analog-to-digital converter.

FIG. 4 shows a conventional analog-to-digital convertor. As is understood from FIG. 5, a pulse generator 40 generates pulses $P_1$, and a saw-toothed wave generator 41 generates saw-toothed waves $E_S$ in synchronism with the former. An amplitude comparator 42 detects points of coincidence of the saw-toothed wave voltage and the analog signal voltage $e_a$, to produce pulses $P_2$. A gate circuit 43 is kept open between pulses $P_1$ and $P_2$, and a counting device 44 acts to count pulses $P_t$ from a timing pulse generator 45 by a number proportional to the input analog signal voltage, thus accomplishing analog-to-digital conversion. It is readily seen that such an analog-to-digital convertor is easily affected by noise signal.

As has been described hereinabove, the present invention is very simple in circuitry, and can convert input voltage into voltage of magnitude or time width proportional to the average value of input voltage. Consequently, the present invention is applicable to a broad range of arts, such as counter type analog-to-digital convertors, amplifiers, etc.

What is claimed is:

1. An analog-to-digital converter comprising: a noise rejection signal modulator including an input signal winding to give average value of an input signal voltage supplied to a pair of input terminals connected across said input signal winding; a controlled switch element inserted between one of said input terminals and said input signal winding; an output signal winding magnetically coupled to said input signal winding to produce a voltage proportional to said average value of voltage; and a constant voltage element connected across output terminals of said output signal winding; said analog-to-digital converter further comprising a gate circuit operating in response to the output voltage from said signal modulator; a timing pulse generator to supply clock pulses of predetermined frequency to said gate circuit; and a counting circuit operatively controlled by the output pulses from said gate circuit, to thereby convert the analogous input signal voltage into a pulse count proportional to the average value of said voltage.

2. An analog-to-digital converter according to claim 1 wherein the switch element is operated in a manner which satisfies the relation $$\sum_{K=1}^{\infty} \frac{2V_K}{K\omega} \sin \frac{K\omega T}{2} \sin \left(\frac{K\omega T}{2} + \phi_K\right) = 0$$

where $V_K$ is the amplitude, $\omega$ is the angular frequency, and $\phi_K$ is the phase difference of an undesired periodic noise component in the input signal voltage, and where T is the operating time of the switch element, the switch element being operated for a time interval of at least one fundamental period of the undesired periodic noise signal.

References Cited

UNITED STATES PATENTS

| | | | |
|---|---|---|---|
| 3,068,421 | 12/1962 | Duerdoth | 329—107 X |
| 3,166,639 | 1/1965 | Babb | 307—88.5 |
| 3,206,617 | 9/1965 | Scaroni | 307—88.5 |

ROY LAKE, *Primary Examiner.*

ALFRED L. BRODY, *Examiner.*